US007810915B2

(12) United States Patent
Takabe et al.

(10) Patent No.: US 7,810,915 B2

(45) Date of Patent: Oct. 12, 2010

(54) ACTUATOR DEVICE, LIQUID-JET HEAD AND LIQUID-JET APPARATUS

(75) Inventors: Motoki Takabe, Siojiri (JP); Koji Sumi, Shiojri (JP); Motohisa Noguchi, Suwa (JP); Naoto Yokoyama, Nagano-ken (JP); Takeshi Saito, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 825 days.

(21) Appl. No.: 11/730,645

(22) Filed: Apr. 3, 2007

(65) Prior Publication Data

US 2008/0074473 A1 Mar. 27, 2008

(30) Foreign Application Priority Data

Apr. 3, 2006 (JP) ............................ 2006-102353

(51) Int. Cl.
*B41J 2/045* (2006.01)
*H01L 41/00* (2006.01)

(52) U.S. Cl. .......................... 347/70; 347/68; 310/311; 310/365

(58) Field of Classification Search ............ 347/68-72; 310/311, 328, 331, 358, 365, 364
See application file for complete search history.

(56) References Cited

U.S. PATENT DOCUMENTS

| | | | | |
|---|---|---|---|---|
| 6,398,349 | B1 * | 6/2002 | Murai | 347/68 |
| 6,447,106 | B1 | 9/2002 | Watanabe et al. | |
| 6,557,986 | B2 | 5/2003 | Watanabe et al. | |
| 7,381,353 | B2 * | 6/2008 | Lee et al. | 252/511 |
| 2003/0048042 | A1 | 3/2003 | Yamaguchi et al. | |
| 2006/0033404 | A1 | 2/2006 | Fukui et al. | |

FOREIGN PATENT DOCUMENTS

| | | |
|---|---|---|
| CN | 1302258 | 7/2001 |
| JP | 2000-307164 | 11/2000 |
| WO | WO 99/45598 A1 | 9/1999 |

* cited by examiner

*Primary Examiner*—Stephen D Meier
*Assistant Examiner*—Geoffrey Mruk
(74) *Attorney, Agent, or Firm*—Sughrue Mion, PLLC

(57) ABSTRACT

Disclosed is an actuator device that includes a piezoelectric element provided as being freely displaceable on a substrate. The piezoelectric element includes a lower electrode, a piezoelectric layer and an upper electrode. In the actuator device, the Young's modulus of the lower electrode is not less than 200 GPa.

6 Claims, 7 Drawing Sheets

ACTUATOR DEVICE, LIQUID-JET HEAD AND LIQUID-JET APPARATUS

The entire disclosure of Japanese Patent Application No. 2006-102353 filed Apr. 3, 2006 is expressly incorporated by reference herein.

BACKGROUND

1. Technical Field

The present invention relates to an actuator device including piezoelectric elements displaceably provided on a substrate, to a liquid-jet head and to a liquid-jet apparatus both of which use the actuator device.

2. Related Art

As a piezoelectric element used for an actuator device, there is one constituted by interposing, between an upper electrode and a lower electrode, a piezoelectric layer made of a piezoelectric material exhibiting an electromechanical transduction function. An example of such piezoelectric materials is crystallized piezoelectric ceramic. Such an actuator device is generally called an actuator device of flexure vibration mode, and is used by being mounted on a liquid-jet head or the like. Representative examples of the liquid-jet head include an ink-jet recording head in which a part of each pressure-generating chamber communicating with a nozzle orifice that ejects ink droplets is composed of a vibration plate. This vibration plate is deformed by a piezoelectric element to apply pressure to ink in the pressure-generating chamber, and thereby ink droplets are ejected from a nozzle orifice. On the other hand, in an actuator device mounted on the ink-jet recording head, the piezoelectric elements are formed to be independent of one another, and are provided to the pressure-generating chambers, respectively. For this purpose, first, a uniform piezoelectric material layer is formed all over an entire surface of the vibration plate by a film-formation technique, and then the piezoelectric material layer is cut into shapes corresponding to the respective pressure-generating chambers by a lithography method.

Here, the piezoelectric element is formed by stacking, sequentially, a lower electrode, a piezoelectric layer and an upper electrode. The lower electrode is formed by stacking, sequentially, an adhesive layer, a platinum layer and a diffusion preventing layer on a single-crystal silicon substrate, while the piezoelectric layer is constituted by a crystallized piezoelectric film that is made by baking a piezoelectric precursor film formed of a piezoelectric material (see, for example, WO99/45598, pp. 19-23, FIGS. 12-14.).

SUMMARY

Use of a soft material for the lower electrode of the piezoelectric element, however, brings about a problem when the lower electrode used in the piezoelectric element has excellent displacement characteristics. Strain caused by repeated drives of the piezoelectric element causes a loss of malleability in the lower electrode, which, in turn, results in a plastic deformation of the piezoelectric element. The displacement characteristics of the piezoelectric element are, as a consequence, deteriorated. For example, suppose this were a piezoelectric element with a lower electrode made of pure platinum (Pt). The piezoelectric element, when driven repeatedly to make its vibration plate displace by approximately 500 nm, suffers from a 40% decrease in the amount of displacement.

An advantage of some aspects of the invention is to provide an actuator device, a liquid-jet head and a liquid-jet apparatus, capable of preventing a decrease of displacement, from which the piezoelectric element may possibly suffer otherwise.

A first aspect of the invention provides an actuator device which includes a piezoelectric element provided, as being freely displaceable, on a substrate. The piezoelectric element includes: a lower electrode; a piezoelectric layer; and an upper electrode. In the actuator device, the lower electrode has a Young's modulus of 200 GPa or larger.

According to the first aspect, the piezoelectric element does not suffer from a decrease in the amount of displacement for the following reason. Thanks to the stiff lower electrode with a Young's modulus of 200 GPa or larger, the piezoelectric element, even when driven repeatedly, does not cause a loss of malleability in the lower electrode. Consequently, the piezoelectric element suffers from no plastic deformation.

A second aspect of the invention provides the actuator device of the first aspect with the lower electrode made of an alloy containing platinum, oxygen, and a different metal.

According to the second aspect, the use of an alloy containing platinum, oxygen And the different metal for the lower electrode gives the lower electrode a desired stiffness, and allows the lower electrode to maintain an excellent conductivity.

A third aspect of the invention provides the actuator device of the second aspect with the different metal is titanium and the content ratio of the titanium to the platinum is 3% to 30%.

According to the third aspect, adjustment of the composition between platinum and titanium in the alloy used for the lower electrode gives the lower electrode a desired stiffness.

A fourth aspect of the invention provides the actuator device of the second aspect with the different metal is lead and the content ratio of the titanium to the platinum is 1% to 12%.

According to the fourth aspect, adjustment of the composition between platinum and lead in the alloy used for the lower electrode gives the lower electrode a desired stiffness.

A fifth aspect of the invention provides the actuator device of the first aspect with the lower electrode essentially containing at least one metal selected from the group consisting of molybdenum, tantalum, iridium, vanadium, tungsten and chromium.

According to the fifth aspect, the use of a predetermined metal for the lower electrode gives the lower electrode a desired stiffness and gives the lower electrode an excellent conductivity.

A sixth aspect of the invention provides the actuator device of any one of the first to fifth aspects in which the piezoelectric element is provided on the substrate with a vibration plate interposed in between, and in which the lower electrode functions as a part of the vibration plate.

According to the sixth aspect, since the lower electrode with a predetermined stiffness functions as a part of the vibration plate, the piezoelectric element maintains an excellent displacement.

A seventh aspect of the invention provides the actuator device of any one of the first to sixth aspects with each of the layers of the piezoelectric element formed by a film-forming method and a lithography method.

According to the seventh aspect, a high-density piezoelectric element with excellent displacement characteristics is obtained.

An eighth aspect of the invention provides a liquid-jet head including the actuator device of any one of the first to seventh aspects as a pressure generating unit for inducing a change in the pressure to jet a liquid from a nozzle orifice.

According to the eighth aspect, deterioration in droplet-jetting characteristics, which deterioration might possibly be caused by a decrease in the amount of displacement of the piezoelectric element, is prevented. Consequently, a liquid-jet head with an improvement in durability and reliability is obtained.

A ninth aspect of the invention provides a liquid-jet apparatus including the liquid-jet head of the eighth aspect.

According to the ninth aspect, a liquid-jet apparatus with an improvement in durability and reliability is obtained.

DESCRIPTION OF EXEMPLARY EMBODIMENTS

What follows is a detailed description of the invention by way of embodiments.

Embodiment 1

Figure 1:
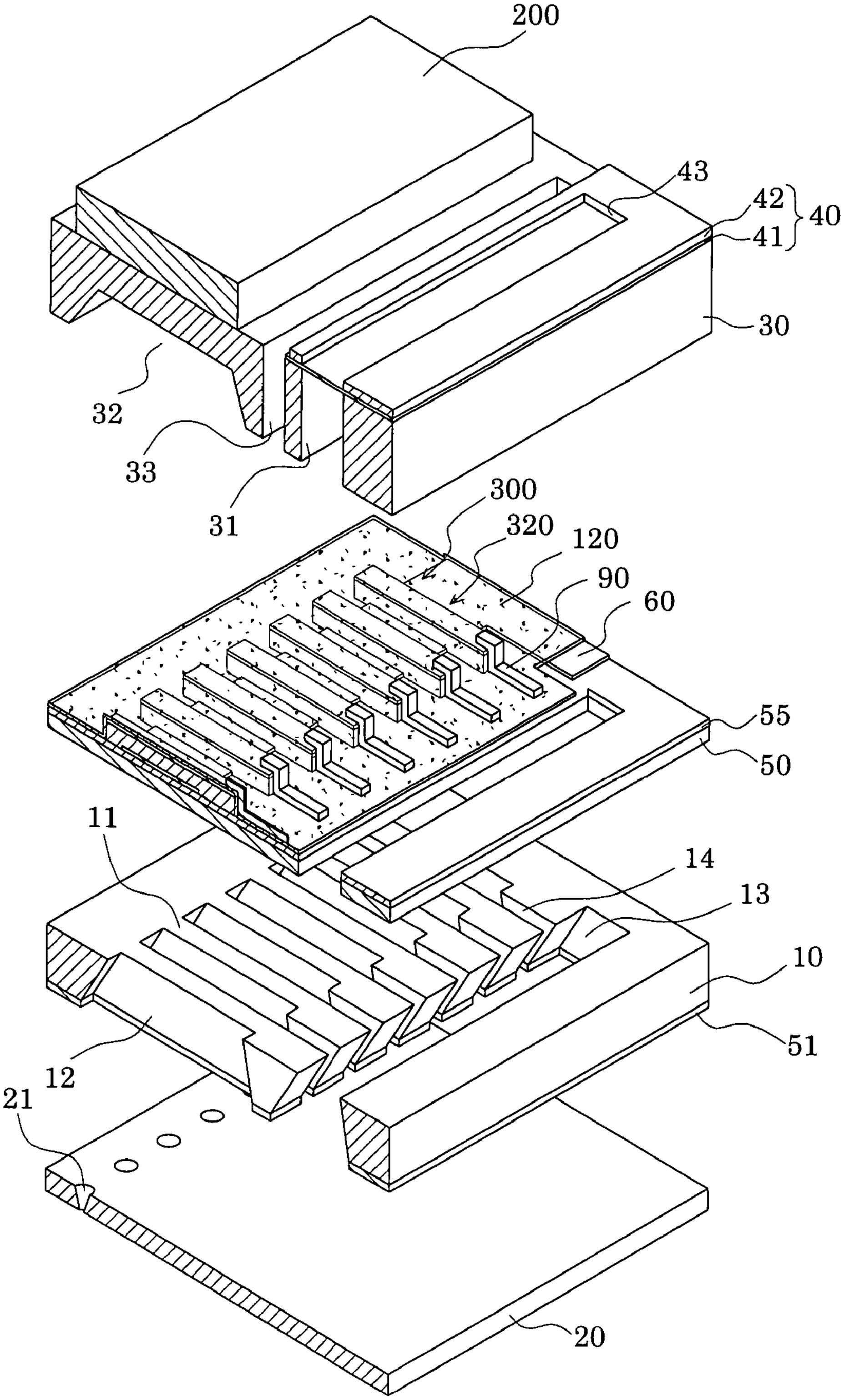
FIG. 1 is an exploded perspective view of a recording head according to Embodiment 1.
Figure 2A:
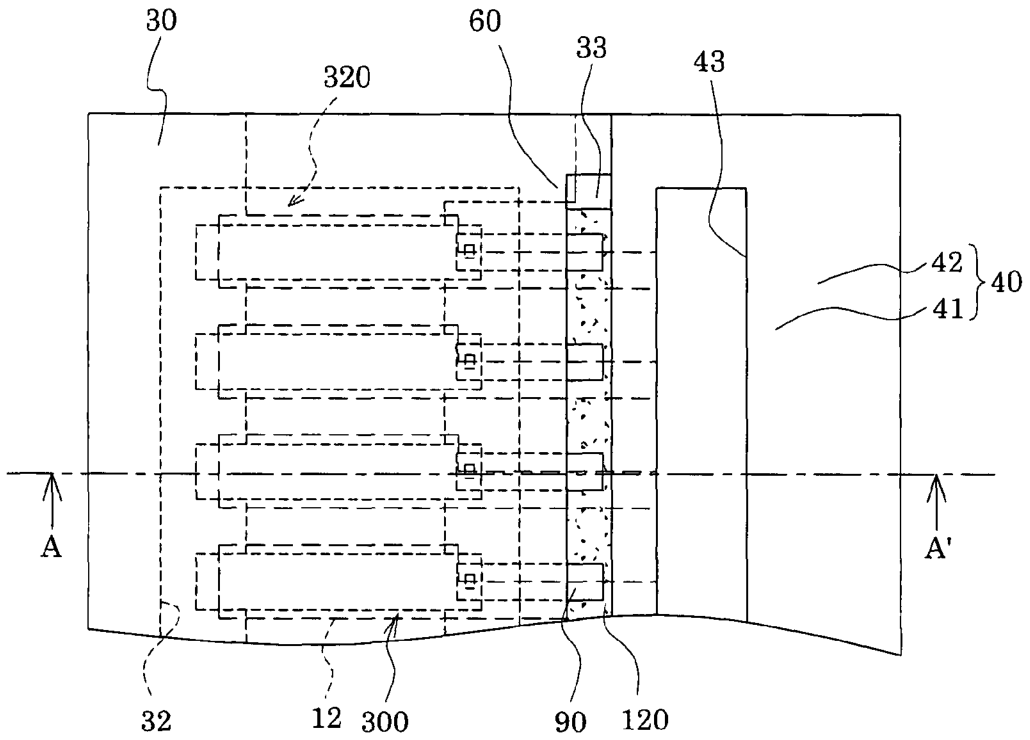
FIG. 2A is a plan view of a main part of the recording head according to Embodiment 1 and FIG. 2B is a cross-sectional view of the main part of the recording head shown in FIG. 2A.
Figure 2B:
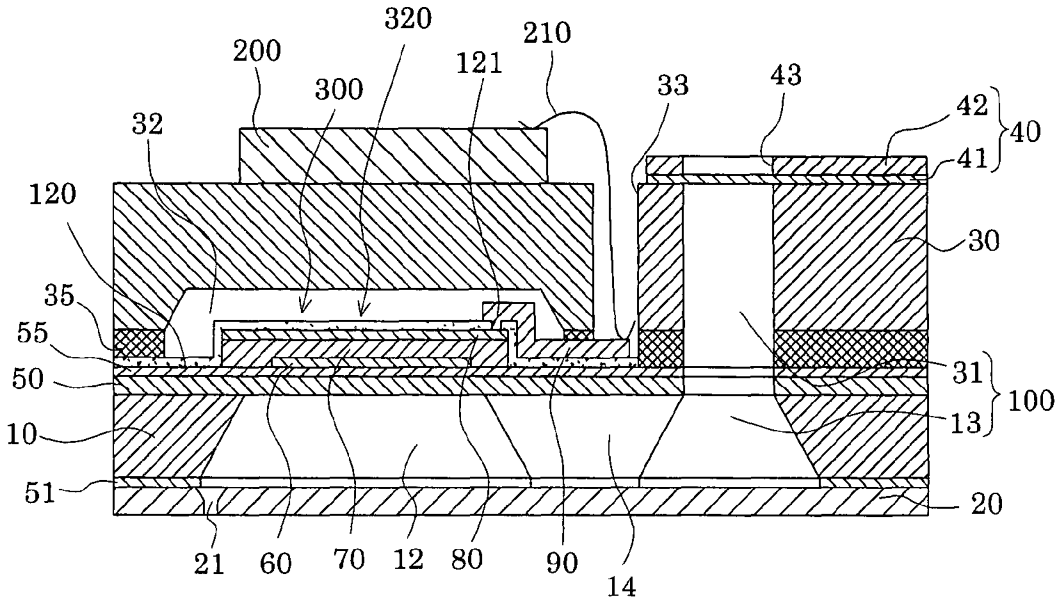

FIG. 1 is an exploded perspective view schematically showing a structure of an ink-jet recording head according to Embodiment 1. FIG. 2A is a plan view of a main part of the ink-jet recording apparatus. FIG. 2B is a cross-sectional view of the part shown in FIG. 2A, taken along the line A-A' in FIG. 2A.

As shown in the drawings, a passage-forming substrate 10 is formed of a single-crystal silicon substrate in this embodiment. On one surface of the passage-forming substrate 10, an elastic film 50 made of silicon dioxide is formed in advance by thermal oxidation in a thickness of 0.5 μm to 2 μm. On the passage-forming substrate 10, a plurality of pressure-generating chambers 12 partitioned by a plurality of compartment walls 11 are provided side by side in the width direction of each of the pressure-generating chambers 12. Additionally, in the passage-forming substrate 10, a communicating portion 13 is formed in a region outside the pressure-generating chambers 12 in the longitudinal direction of each of the pressure-generating chambers 12. An ink supply path 14 provided for each pressure-generating chamber 12 allows the communication portion 13 and the corresponding pressure-generating chamber 12 to communicate with each other, Note that, by communicating with a reservoir portion 31 of a protective plate 30, which will be described later, the communication portion 13 composes a part of a reservoir 100 to be a common ink chamber for the pressure-generating chambers 12. The ink supply path 14 is formed to be narrower than each pressure-generating chamber 12, and maintains, at a constant level, the path resistance of the ink flowing into the pressure-generating chamber 12 from the communicating portion 13.

Additionally, a nozzle plate 20 having nozzle orifices 21 drilled therein is fixed to an opening surface side of the passage-forming substrate 10 with a mask film 51 interposed in between by use of an adhesive agent, a thermal adhesive film or the like. A description of the mask film 51 will be given later. The nozzle orifices 21 communicate respectively with vicinities of the opposite ends of the pressure-generating chambers 12 to the corresponding ink supply paths 14. The nozzle plate 20 is made of glass ceramic, a single-crystal silicon substrate, stainless steel or the like having a thickness of, for example, a 0.01 mm to 1.00 mm, and having a coefficient of linear expansion of, for example, $2.5\times10^{-6}$/° C. to $4.5\times10^{-6}$/° C. at a temperature not higher than 300° C.

On the side opposite to the side where opening surface of the passage-forming substrate 10 is located, the elastic film 50 made of silicon dioxide is formed, as described above, in a thickness of about 1.0 μm, for example. On this elastic film 50, a layer of an insulation film 55 made of zirconium oxide ($ZrO_2$) is formed in a thickness of, for example, about 0.3 μm to 0.4 μm. Additionally, piezoelectric elements 300 are formed on this insulation film 55. Here, a lower electrode film 60, a piezoelectric layer 70 and an upper electrode film 80 constitute each piezoelectric element 300. For example, the thickness of the lower electrode film 60 is about 0.1 μm to 0.2 μm, that of the piezoelectric layer 70 is about 0.5 μm to 5 μm, and that of the upper electrode film 80 is about 0.05 μm. Generally, in the configuration of the piezoelectric element 300, any one of the two electrodes of the piezoelectric element 300 serves as a common electrode, while the other one of these electrodes and the piezoelectric layer 70 are patterned for each pressure-generating chamber 12. The patterned one of the electrodes and the piezoelectric layer 70 constitute a part termed as a piezoelectric active portion 320 in which a piezoelectric strain is induced by a voltage applied to both electrodes. In this embodiment, the lower electrode film 60 is used as the common electrode to the piezoelectric elements 300, and the upper electrode film 80 is used as individual electrodes of the respective piezoelectric elements 300. However, the roles of the two electrode films may be reversed to meet the needs for the drive circuit and the wiring. In any case, the piezoelectric active portion 320 is formed for each pressure-generating chamber 12. Here, the piezoelectric element 300 and the vibration plate where displacement occurs when the piezoelectric elements 300 are driven constitute a unit called an actuator device. In the embodiment, the lower electrode film 60 is provided along a direction in which a plurality of piezoelectric elements 300 are provided in a row. In addition, in the embodiment, end portions of the lower electrode film 60 in the longitudinal direction of each pressure-generating chamber 12 are provided so as to face each pressure-generating chamber 12. Moreover, in the above described example, the elastic film 50, the insulation film 55 and the lower electrode film 60 function together as a vibration plate. The invention is not limited to the case of this example. For example, the lower electrode film 60 may be configured to function by itself as a vibration plate without the elastic film 50 and the insulation film 55.

Examples of the materials for the lower electrode 60 of the embodiment include a metal and a ceramic which have a Young's modulus of 200 GPa or larger. Specifically, an alloy made of platinum (Pt), oxygen (O), and a different metal may be used for this purpose, in a case where the lower electrode 60 is made of a metal. Another example of the material for the lower electrode 60 includes a metal essentially containing at least one metal selected from the group consisting of molybdenum (Mo), tantalum (Ta), iridium (Ir), vanadium (V), tungsten (W), and chromium (Cr).

In a case of the lower electrode film 60 made of platinum, oxygen and another metal, examples for the other metal include titanium (Ti) and lead (Pb). In the lower electrode 60 made of an alloy containing platinum, oxygen and titanium, the content ratio of titanium to platinum is preferably 3% to 30%, while in the lower electrode film 60 made of an alloy containing platinum, oxygen and lead, the content ratio of lead to platinum is preferably it to 12%. The lower electrode film 60 is made to have a Young's modulus of 200 GPa by adjusting the composition of the different metal to platinum in this way.

The lower electrode film 60 of an alloy is formed by the following method, for example. An adhesion layer is formed on the insulation film 55, a metal layer made of titanium is formed on the adhesion layer, and a platinum layer is further formed on the metal layer, to form a layered structure. Then, the layered structure is subjected to baking to form the piezoelectric layer 70 following a manufacturing method, which will be described in detail later. At the time of baking, each of these layers is also heated. Consequently, the lower electrode film 60 is transformed into an alloy. When the lower electrode film 60 is made of an alloy containing platinum, lead and oxygen, the lower electrode film 60 made of the alloy may be formed directly on the insulation film 55. In the case of using titanium as the different metal, the lower electrode film 60 of an alloy made of platinum, titanium and oxygen may also be formed directly on the insulation film 55. An example of the material for the adhesive layer includes a metal essentially containing at least one metal selected from the group consisting of titanium (Ti), chromium (Cr), Tantalum (Ta), Zirconium (Zr) and Tungsten (W). In a case where titanium (Ti) is used for the adhesive layer and where an alloy made of platinum, titanium and oxygen is used for the lower electrode film 60, the titanium adhesive layer may be a part of the alloy used for the lower electrode film 60.

As has been described above, when a metal with a Young's modulus of 200 GPa or larger, a ceramic, or the like is used for the lower electrode film 60, the lower electrode film 60 withstands the strain caused by the repeated drives of the piezoelectric element 300. In addition, the lower electrode 60 is prevented from losing its malleability, which might otherwise happen when the piezoelectric element 300 is repeatedly driven. As a result, the plastic deformation of the piezoelectric element 300 is prevented. To be more precise, a deflection of the piezoelectric element 300 applies a stress of 200 GPa to the lower electrode film 60. The lower electrode film 60 with a low Young's modulus plastically deforms when the piezoelectric element 300 is repeatedly driven. Since the piezoelectric element 300 employs the lower electrode film 60 of the embodiment with a Young's modulus of 200 GPa or larger, the piezoelectric element 300 does not plastically deform even when the piezoelectric element 300 is repeatedly driven. Consequently, a decrease in the amount of displacement of the piezoelectric element 300 is prevented. Specifically, in the piezoelectric element 300 using the lower electrode film 60 of the embodiment with a Young's modulus of 200 GPa or larger, a decrease in the amount of displacement of the piezoelectric element 300 is prevented even when the piezoelectric element 300 is driven repeatedly twenty billion times.

The insulation film 55, which serves as the vibration plate in the embodiment, is made of zirconium dioxide ($ZrO_2$), and has a toughness of 6 $MN/m^{2/3}$. For this reason, the lower electrode film 60 preferably has a toughness approximately equivalent to or higher than the zirconium dioxide, that is, 6 $MN/m^{2/3}$.

The piezoelectric layer 70 is a crystalline film with the perovskite structure formed on the lower electrode film 60, and is made of a ferroelectric ceramic material showing electromechanical transduction effects. Preferable materials for the piezoelectric layer 70 include a ferroelectric piezoelectric material such as lead zirconium titanate (PzT), and materials made by adding, to a ferroelectric piezoelectric material, metal oxides such as niobium oxide, nickel oxide and magnesium oxide. Specifically, lead titanate ($PbTiO_3$), lead zirconium titanate ($Pb(Zr, Ti)O_3$), lead zirconate ($PbZrO_3$), lead lanthanum titanate ($(Pb, La)TiO_3$), lead lanthanum zirconium titanate ($(Pb, La)(Zr, Ti)O_3$), lead magnesium niobate-lead zirconium titanate ($Pb(Zr, Ti)(Mg, Nb)O_3$) or the like can be used. The piezoelectric layer 70 is made as thin as to suppress cracks that might be produced in the manufacturing process, and as thick as to show sufficient displace characteristics. For example, the piezoelectric layer 70 of the embodiment is formed in approximately 1 μm to 2 μm.

A moisture-resistant protective film 120 is provided to the surface of the passage-forming substrate 10, which surface is on the side where the piezoelectric elements 300 are located. The protective film 120 covers the piezoelectric elements 300 each of which is composed of the lower electrode film 60, the piezoelectric layer 70 and the upper electrode film 80 (the piezoelectric active portion 320). Here, for the protective film 120, it is preferable to use an inorganic insulation material, such as a silicon oxide ($SiO_x$), a tantalum oxide ($TaO_x$) or an aluminum oxide ($AlO_x$). It is especially preferable to use an aluminum oxide ($AlO_x$), which is an inorganic amorphous material, for example, alumina ($Al_2O_3$). Use of alumina as a material for the protective film 120 sufficiently prevents moisture permeation under a high humidity environment even in a case where the protective film 120 is made relatively thin, for example, about 100 nm. Meanwhile, the protection film 120 made of alumina does not inhibit the deformation of the piezoelectric elements 300.

Lead electrodes 90 made, for example, of gold (Au) are provided on the protective film 120. One end portion of each lead electrode 90 is connected to the corresponding upper electrode film 80 via a corresponding connecting hole 121 formed in the protective film 120. In addition, the other end portion of each lead electrode 90 extends to the vicinity of an end portion of the passage-forming substrate 10. The extended head-end portions of the lead electrodes 90 are connected to a drive circuit 200 for driving the piezoelectric elements 300 respectively via connection wirings 210. Note that a detailed description of the drive circuit 200 will be given later.

Furthermore, a protective plate 30 including a piezoelectric element holding portion 32 is joined, by an adhesive agent 35, onto the passage-forming substrate 10, on which the piezoelectric elements 300 are formed. The piezoelectric element holding portion 32 is a space in a region facing the piezoelectric elements 300. The space may be small as long as the movement of the piezoelectric elements 300 is undisturbed. The space may either be hermetically sealed, or not hermetically sealed.

A reservoir portion 31 is provided to the protective plate 30 in a region facing the communicating portion 13. As has been described above, this reservoir portion 31 is allowed to communicate with the communicating portion 13 of the passage-forming substrate 10. The reservoir portion 31 and the communicating portion 13 thus constitute a reservoir 100, which is a common ink chamber to the pressure-generating chambers 12. A through hole 33, which penetrates the protective plate 30 in the thickness direction thereof, is formed in a region of the protective plate 30 between the piezoelectric element holding portion 32 and the reservoir portion 31. A part of the lower electrode film 60, and head-end portion of the lead electrode 90, are exposed inside of the through hole 33.

A driver circuit 200 for driving the piezoelectric elements 300 is mounted on the protective plate 30. A driver IC, a semiconductor integrated circuit or the like constitutes the driver circuit 200. The driver circuit 200 and the lead electrodes 90 are electrically connected to each other through the connection wiring 210, which is formed of a conductive wire such as a bonding wire.

The protective plate 30 is preferably made of a material with a thermal expansion coefficient approximately equal to that of the material of the passage-forming substrate 10. Examples of such a material include glass and a ceramic material. In the embodiment, the protective plate 30 is made of a single-crystal silicon substrate, which is the same material that the passage-forming substrate 10 is made of.

A compliance plate 40, composed of a sealing film 41 and a fixing plate 42, is joined onto the protective plate 30. The sealing film 41 is made of a flexible material with a low rigidity—a 6-μm thick polyphenylene sulfide (PPS) film, for example—and seals one direction of the reservoir portion 31. The fixing plate 42 is made of a hard material such as a metal—a 30-μm thick stainless steel (SUS), for example. In the fixing plate 42, a region facing the reservoir 100 is formed into an opening portion 43 by completely removing the fixing plate 42 in the thickness direction thereof. Accordingly, only the flexible sealing film 41 seals one direction of the reservoir 100.

An ink-jet recording head of this embodiment takes in ink from unillustrated external ink supplying means, and the inside of the components from the reservoirs 100 to the nozzle orifices 21 is filled with the ink. Then, a voltage is applied between the lower electrode film 60 and each of the upper electrode films 80, which correspond to each of the pressure-generating chambers 12, in response to a recording signal from the driver circuit 200. The elastic film 50, the lower electrode film 60 and the piezoelectric layer 70 are deflected to increase the pressure in each of the pressure-generating chambers 12. The ink droplets are ejected from the nozzle orifices 21 in this way.

Figure 3A:
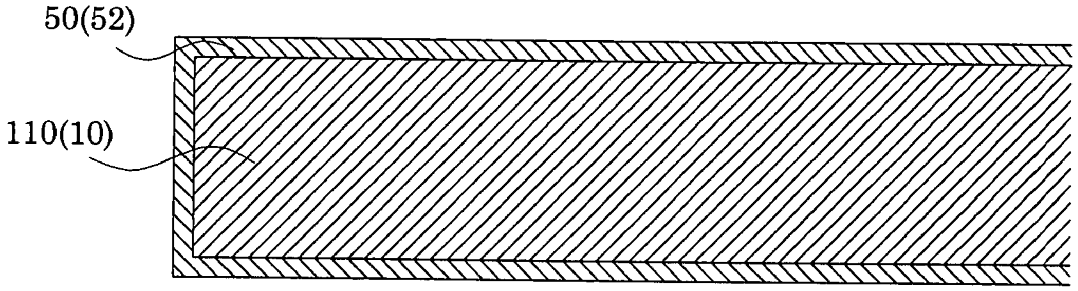
FIGS. 3A and 3B are cross-sectional views for describing a method of manufacturing the recording head according to Embodiment 1.

Now, a manufacturing method of an ink-jet recording head will be described with reference to FIGS. 3 to 6. FIGS. 3 to 6 are cross-sectional views of one of the pressure-generating chambers 12 taken along the longitudinal direction thereof. First of all, as FIG. 3A shows, a silicon wafer—a wafer 110 for a passage-forming substrate—is thermally oxidized in a diffusion furnace at about 1100° C. to form, on the surface thereof, a silicon dioxide film 52 constituting the elastic film 50. In this embodiment, a highly rigid silicon wafer with a relatively large thickness of about 625 μm is used as the wafer 110 for a passage-forming substrate.

Figure 3B:
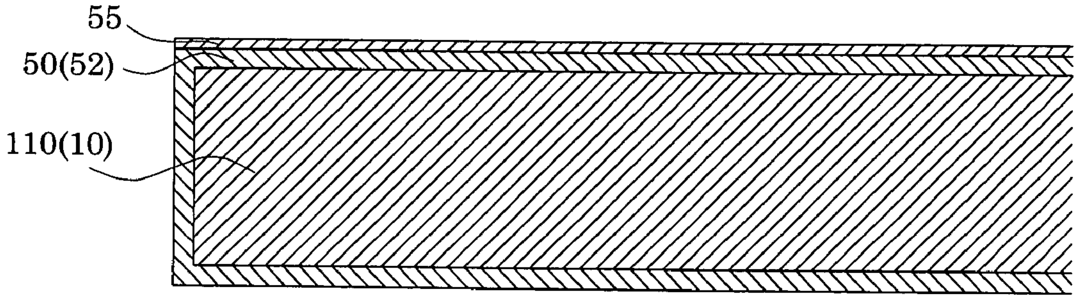

Next, as FIG. 3B shows, the insulation film 55 made of zirconium oxide ($ZrO_2$) is formed on the elastic film 50 (the silicon dioxide film 52). Specifically, a zirconium (Zr) layer is formed on the elastic film 50 (the silicon dioxide film 52) by, for example, a sputtering method. Then, the zirconium layer is thermally oxidized in a diffusion furnace at, for example, 500° C. to 1200° C. to form the insulation film 55 made of zirconium oxide.

Figure 4A:
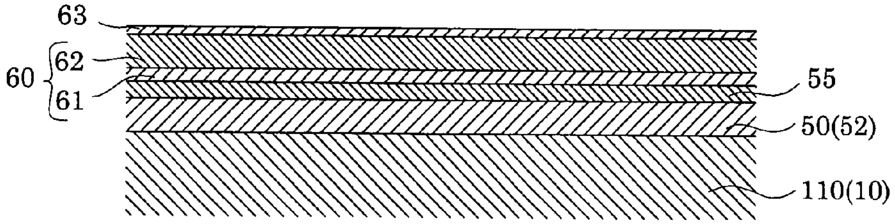
FIGS. 4A to 4E are cross-sectional views for describing the method of manufacturing the recording head according to Embodiment 1.

Next, as FIG. 4A shows, the lower electrode film 60, made up of an adhesion layer 61 and a platinum layer 62, is formed. Specifically, to begin with, the adhesion layer 61 made of titanium (Ti) is formed on the insulation film 55 in a thickness of 5 nm to 50 nm. In this embodiment, the adhesion layer 61 was formed in a thickness of 10 nm. The adhesion layer 61 thus provided as the lower most layer of the lower electrode film 60 increases the adhesion between the insulation film 55 and the lower electrode film 60.

Next, a layer made of platinum (Pt)—the platinum layer 62—is formed on the adhesion layer 61 in a thickness of 50 nm to 500 nm. In this embodiment, the platinum layer 62 was formed in a thickness of 130 nm. The lower electrode film 60 is thus formed as constituted by the adhesion layer 61 and the platinum layer 62.

The adhesion layer 61 made of titanium (Ti) and the platinum layer 62 made of platinum are concurrently heated when the piezoelectric layer 70 is formed by baking in a later process. Thus, the lower electrode film 60 is transformed into an alloy composed of titanium (Ti), platinum (Pt) and oxygen (O). This will be described later. To make the Young's modulus of the lower electrode film 60 be equal to or higher than 200 GPa, it is preferable that the thicknesses of the adhesion layer 61 and of the platinum layer 62 be adjusted at this time so as to make the titanium content to the platinum content be 3% to 30%.

Next, a layer made of titanium—a titanium layer 63—is formed on the lower electrode film 60 in a thickness of 1 nm to 20 nm—in this embodiment, 4 nm. The titanium layer 63 thus formed on the lower electrode film 60 helps to control the priority orientation of the piezoelectric layer 70 in the (100) or the (111) orientation when the piezoelectric layer 70 is formed on the lower electrode film 60 with the titanium layer 63 interposed in between, in a later process. The piezoelectric layer 70 thus obtained is suitable for an electromechanical transduction element. When the piezoelectric layer 70 is crystallized, the titanium layer 63 functions as a seed to promote the crystallization. After the baking of the piezoelectric layer 70, a part of, or the entire part of, the titanium layer 63 is diffused into the piezoelectric layer 70.

Incidentally, each of the layers 61 and 62 that constitute the lower electrode film 60 as well as the titanium layer 63 can be formed by, for example, a DC magnetron-sputtering method.

Next, the piezoelectric layer 70 is formed. The piezoelectric layer 70 is formed, in this embodiment, by a sol-gel method. Specifically, in this embodiment, the piezoelectric layer 70 is formed by use of what is called a sol-gel method. The piezoelectric layer 70 made of a metallic oxide is obtained by the sol-gel method in the following way. First, a metal organic compound is dissolved and dispersed into a catalyst to obtain what is called sol; secondly, the sol is made into gel through application and drying of the sol; and, thirdly, the gel is baked at a high temperature. Examples of a material used for the piezoelectric layer 70 include a ferroelectric-piezoelectric material such as lead-zirconate-titanate (PZT), and a relax or ferroelectric material formed by adding metal such as niobium, nickel, magnesium, bismuth or yttrium to the ferroelectric-piezoelectric material. Note that the method of forming the piezoelectric layer 70 is not limited to the sol-gel method, and that the piezoelectric layer 70 may be formed by, for example, a metal-organic decomposition (MOD) method.

Figure 4B:
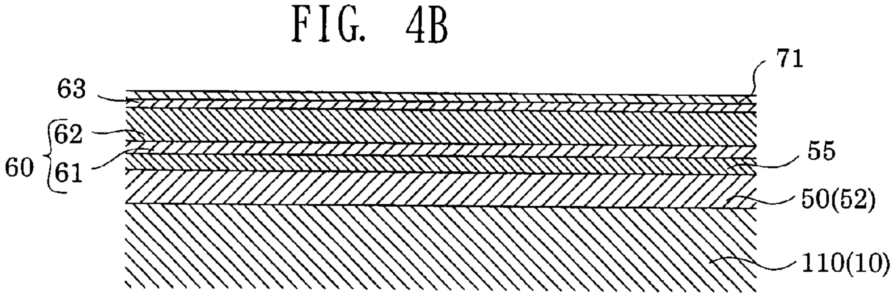

Specifically, as FIG. 4B shows, first, a film of PZT precursor—a piezoelectric precursor film 71—is formed on the lower electrode film 60 that has not been subjected to patterning yet. In other words, a sol (solution) containing an organic-metal compound is coated to the passage-forming substrate 10 on which the lower electrode film 60 is formed (coating process). A drying process follows, in which the piezoelectric precursor film 71 is dried by being heated at a predetermined temperature for a certain period of time. For example, the piezoelectric precursor film 71 in this embodiment can be dried by being maintained at 170° C. to 180° C. for 8 minutes to 30 minutes. A preferable rate of temperature rise is 0.5° C./sec to 1.5° C./sec in the drying process. The "rate of temperature rise" here is defined as follows. First, the difference between the temperature at the time when the heating begins and the target temperature to be reached. The temporal changing rate of temperature between the temperature risen from the start of the heating by 20% of the above-mentioned difference and the temperature risen by 80% of the difference. For example, assuming that the temperature rises from the room temperature of 25° C. to 100° C. in 50 seconds. In this case, the rate of temperature rise is: (100−25)×(0.8−0.2)/50=0.9° C./sec.

A degreasing process comes next. To carry out the degreasing, the piezoelectric precursor film 71 is heated to a predetermined temperature, and then is maintained at the temperature for a certain period of time. In this embodiment, for example, the piezoelectric precursor film 71 is heated to approximately 300° C. to 400° C., and then is maintained at the temperature for approximately 10 minutes to 30 minutes to carry out the degreasing. Note that the degreasing here is removing organic compositions contained in the piezoelectric precursor 71 from the piezoelectric precursor 71. The organic compositions at the time when they are removed take the form such as $NO_2$, $CO_2$, $H_2O$ and the like. In addition, a preferable rate of temperature rise is 0.5 [° C./sec] to 1.5 [° C./sec].

Figure 4C:
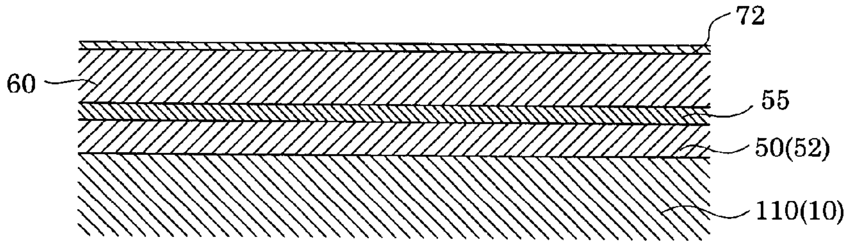

What follows next is a baking process. As FIG. 4C shows, a piezoelectric film 72 is formed by crystallizing the piezoelectric precursor film 71. For this purpose, the piezoelectric precursor film 71 is heated to a predetermined temperature and then is maintained at the temperature for a certain period of time. In the baking process, the piezoelectric precursor film 71 is preferably heated to 680° C. to 900° C., but a more preferable heating temperature is 700° C. or lower. The reason is that the layers 61 and 62 of the lower electrode film 60 are heated at one time to be transformed into an alloy. In this way, the lower electrode film 60 is formed as being made of a strong alloy with a Young's modulus of 200 GPa or larger. In this embodiment, the piezoelectric precursor film 71 was baked by heating at 680° C. for 5 minutes to 30 minutes to form the piezoelectric film 72. There is no particular limitation on the way to heat the upper electrode film 80 in this baking process, but a relatively fast rate of temperature rise is preferable. A rapid thermal annealing (RTA) method is one of the methods for accomplishing the purpose. For example, in this embodiment, the piezoelectric film was heated at a relatively high rate of temperature rise by use of an RTA apparatus. With the RTA apparatus, the piezoelectric film is heated by irradiation of an infrared lamp. Note that the rate of temperature rise is 50° C/sec or faster when the piezoelectric precursor film 71 is baked.

Figure 4D:
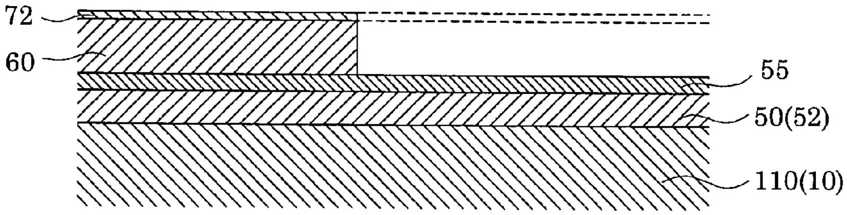
Figure 4E:
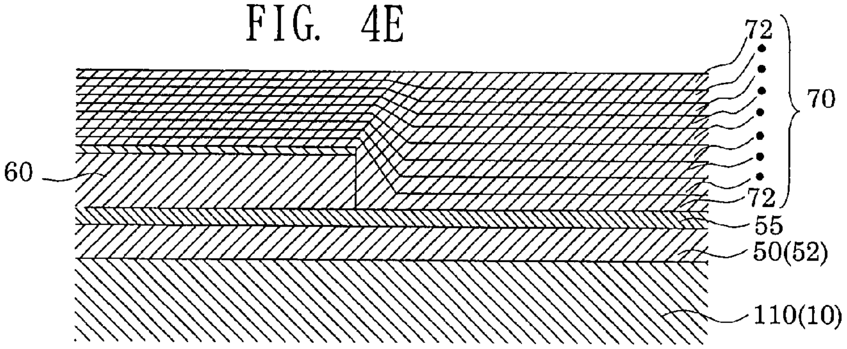

Then, as FIG. 4D shows, once the first one of the piezoelectric film 72 on the lower electrode film 60 is finished, the lower electrode film 60 and the first piezoelectric film 72 are simultaneously subjected to patterning.

Now assume that the titanium layer 63 is formed on the lower electrode film 60, then the titanium layer 63 and the lower electrode film 60 are subjected to patterning, and then the first piezoelectric film 72 is formed. In this case, since the lower electrode film 60 is patterned through a photo process, an ion-milling process, and an ashing process, the titanium layer 63 suffers from alteration. The first piezoelectric film 72 formed on the altered titanium layer 63 makes the crystallinity of the piezoelectric film 72 unfavorable. The crystalline state of the first piezoelectric film 72 affects the crystalline growth of the subsequent the piezoelectric films 72 formed on the first piezoelectric film 72. As a result, a favorable crystallinity of the piezoelectric films 72 as a whole cannot be obtained.

In contrast, the simultaneous patterning of the first piezoelectric film 72 and the lower electrode film 60 after the first piezoelectric film 72 is formed has the following advantage. The first piezoelectric film 72 acts, more than the titanium layer 63, as a seed when a favorable crystal growth of the subsequent piezoelectric films 72 is pursued. For this reason, an alteration layer, formed, if any, very thinly on the superficial portion of the first layer through the patterning, does not affect much the crystal growth of the subsequent piezoelectric films 72.

The above-mentioned processes of coating, drying, degreasing and baking constitute a piezoelectric-film formation process. Once the patterning is finished, the piezoelectric-film formation process is repeated a plurality of times. Thus, the piezoelectric layer 70 with a plurality of piezoelectric films 72 is formed in a predetermined thickness, as FIG. 4E. For example, when every coating of the sol gives approximately 0.1 μm film thickness, the total film thickness of the piezoelectric layer 70 including ten piezoelectric films 72 becomes approximately 1.1 μm.

As has been described above, once the formation of the first piezoelectric film 72 on the lower electrode film 60 is finished, these films are simultaneously subjected to patterning. When the second piezoelectric film 72 is formed, the difference in bedding may negatively affect the crystallinity of the second piezoelectric film 72, especially in the vicinity of the boundary between the portion where the lower electrode film 60 and the first piezoelectric film 72 are formed, and the portion other than the one that has just been mentioned. The above-described method including the simultaneous patterning can make the negative influence smaller, or can mitigate the negative influence. As a result, a favorable crystal growth of the second piezoelectric film 72 proceeds in the vicinity of the boundary between the lower electrode 60 and the portion other than the lower electrode 60. The piezoelectric layer 70 is thus formed with an excellent crystallinity.

As has been described above, when the piezoelectric layer 70 is formed, the lower electrode film 60 is heated simultaneously to form the lower electrode film 60 made of an alloy composed of the adhesion layer 61 of titanium (Ti), the platinum (Pt) layer 62, and oxygen (O). Here, the adhesion layer 61 of a 10-nm thickness and the platinum layer 62 of a 130-nm thickness are formed in this embodiment. Accordingly the titanium composition to the platinum composition in the lower electrode film 60 is approximately 7.7%. When the titanium composition to platinum composition in the lower electrode film 60 is 3% to 30%, such as the case in this embodiment, the lower electrode film Go is formed so hard to have a Young's modulus of 200 GPa or larger. As a result, the lower electrode film 60 is not plastically deformed even when the piezoelectric element 300 is repeatedly driven. Consequently, a decrease in the amount of displacement of the piezoelectric element 300 is prevented.

Once the formation of the piezoelectric layer 70 is finished through the processes shown in FIGS. 4B to 4E, the upper electrode film 80 made of, for example, iridium (Ir), is formed on the entire surface of the wafer 110 for a passage-forming substrate. Then, the piezoelectric layer 70 and the upper electrode film 80 are subjected to patterning to make the regions that correspond respectively to the pressure-generating chambers 12 to be formed into the piezoelectric elements 300.

Figure 5A:
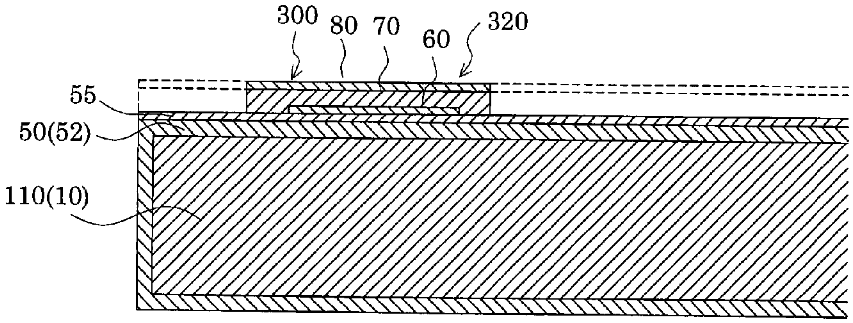
FIGS. 5A to 5D are cross-sectional views for describing the method of manufacturing the recording head according to Embodiment 1.
Figure 5B:
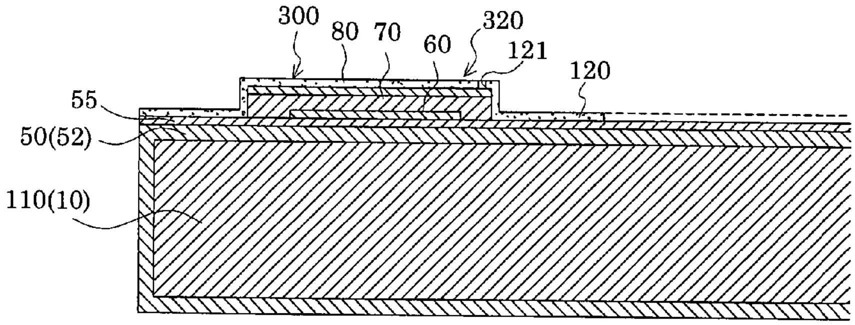

Next, as shown in FIG. 5B, the protective film 120 is formed on the entire surface of the wafer 110 for a passage-forming substrate, and then is subjected to patterning to form a connection hole 121. Preferable materials for the protective film 120 include moisture-resistant materials, for example, inorganic insulation materials such as a silicon oxide ($SiO_x$), a tantalum oxide ($TaO_x$), and an aluminum oxide ($AlO_x$). Among them, an aluminum oxide ($AlO_x$)—which is an inorganic amorphous material—for example, alumina ($Al_2O_3$), is especially preferable.

Figure 5C:
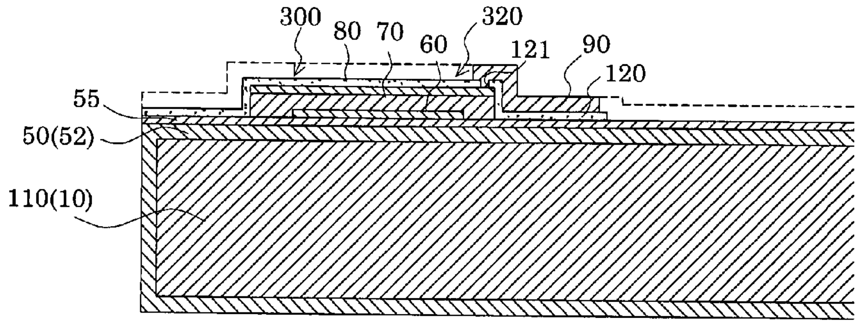

Next, as shown in FIG. 5C, the lead electrodes 90 made of, for example, gold (Au), are formed on the entire upper surface of the wafer 110 for a passage-forming substrate. Then patterning is carried out for each piezoelectric element 300 with a mask pattern (not illustrated) made of, for example, a resist.

Figure 5D:
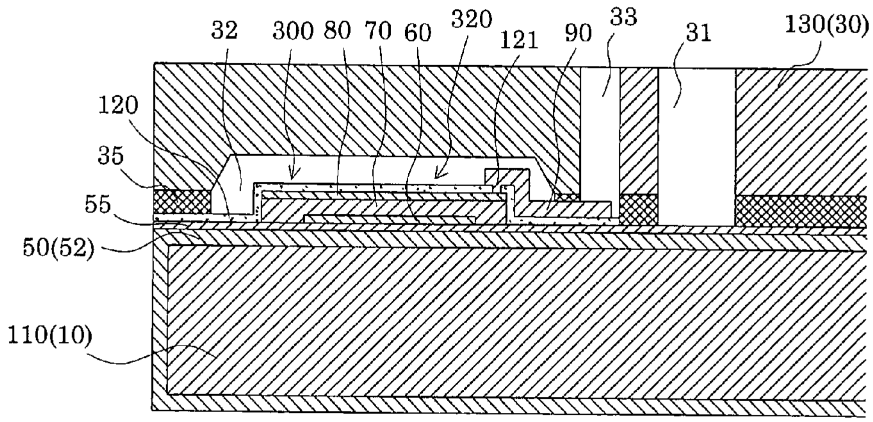

Next, as shown in FIG. 5D, a wafer 130 for a protective plate—a silicon wafer to be made into a plurality of protective plates 30—is joined, by use of the adhesive agent 35, to the wafer 110 for a passage-forming substrate. Specifically, the wafer 130 is joined to the side of the wafer 110 where the piezoelectric elements 300 are formed. Joining the wafer 130 for a protective plate, which is, for example, approximately 400 μm thick, onto the wafer 110 for a passage-forming substrate remarkably enhances the rigidity of the wafer 110.

Figure 6A:
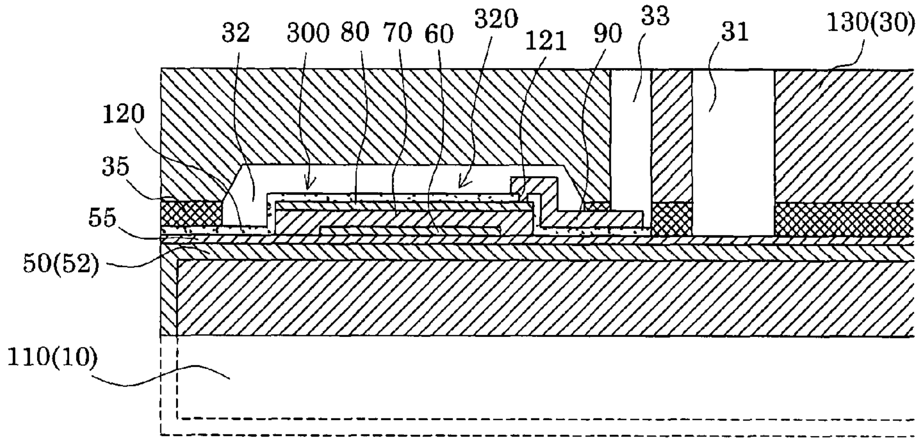
FIGS. 6A to 6C are cross-sectional views for describing the method of manufacturing the recording head according to Embodiment 1.

Next, as shown in FIG. 6A, the wafer 110 for a passage-forming substrate is formed into a predetermined thickness. To this end, the wafer 110 for a passage-forming substrate is polished until the wafer 110 has approximately a certain thickness, and then the wafer 110 thus polished is subjected to wet-etching by use of fluoric-nitric acid. For example, in this embodiment, the wafer 110 for a passage-forming substrate is subjected to the etching process so as to be formed in a thickness of approximately 70 μm.

Figure 6B:
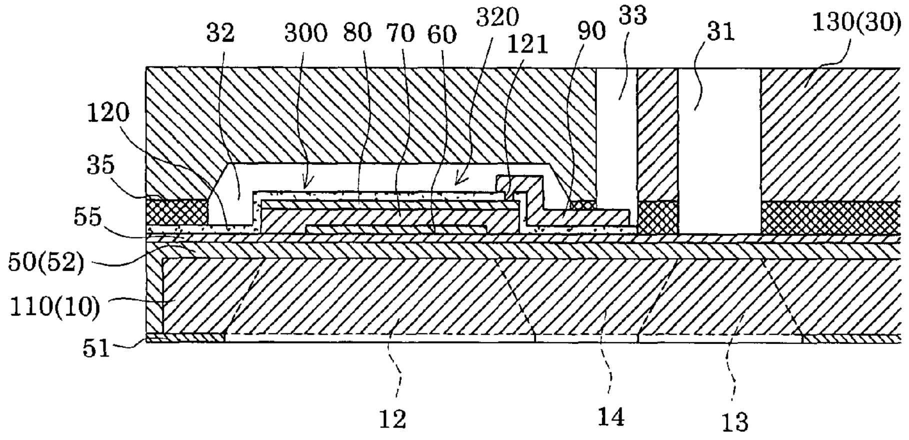
Figure 6C:
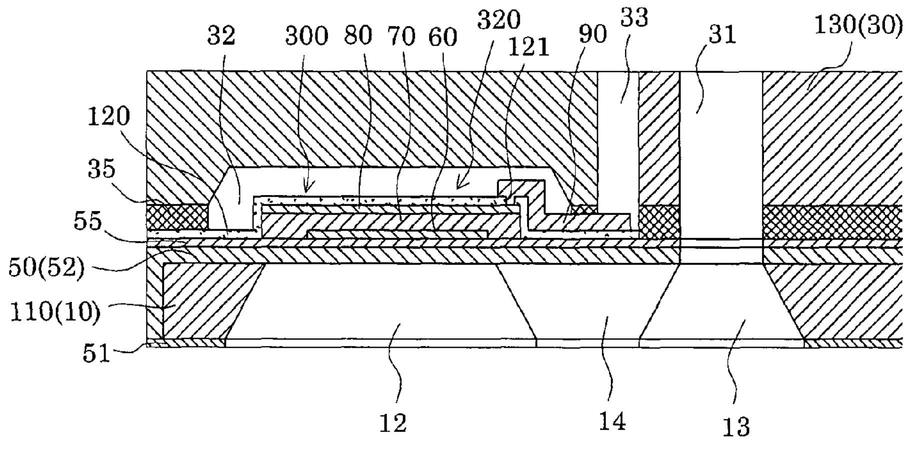

Next, as shown in FIG. 6B, a mask film 51 made of, for example, silicon nitride (SiN) is newly formed on the wafer 110 for a passage-forming substrate, and is patterned into a predetermined shape. Subsequently, as shown in FIG. 6C, the pressure-generating chambers 12, the communicating portion 13, the ink supply paths 14 and the like, all of which correspond to the respective piezoelectric elements 300, are formed in the wafer 110 for a passage-forming substrate. To this end, the wafer 110 for a passage-forming substrate is subjected to an anisotropic-etching (wet-etching) through the mask film 51 using an alkaline solution such as KOH.

Thereafter, unnecessary parts in outer peripheral edge portions of the wafer 110 for a passage-forming substrate and of the wafer 130 for a protective plate are removed. The unnecessary parts are, for example, cut off by dicing or the like. Then, the nozzle plate 20, with the nozzle orifices 21 drilled therein, is joined onto the surface of the wafer 110 for a passage-forming substrate, which surface is located on the opposite side from the surface onto which the wafer 130 for a protective plate is joined. The compliance plate 40 is joined to the wafer 130 for a protective plate, and then the wafer 110 for a passage-forming substrate and the like are divided into one-chip sized pieces each, as shown in FIG. 1, constituting the passage-forming substrate 10 and the like. The ink-jet recording head of this embodiment is formed in this way.

Other Embodiments

While the embodiments of the invention have been described hereinabove, the basic configuration of the invention is not limited to embodiments described above. For example, in the method of manufacturing the ink-jet recording head of Embodiment 1, titanium (Ti) is used for the adhesion layer 61, so that the platinum layer 62 is additionally provided to form, together with the adhesion layer 61, the lower electrode film 60. In the case, however, of using a metal other than titanium (Ti)—for example, chromium (Cr), tantalum (Ta), zirconium (Zr), tungsten (W) or the like—for the adhesion layer 61, a metal layer made of titanium (Ti) and formed on the adhesion layer 61 in a thickness of 5 nm to 50 nm allows the titanium content to the platinum in the lower electrode film 60 to be made 3% to 30%, as the Embodiment 1.

In addition, the method of manufacturing the ink-jet recording head of the Embodiment 1, the lower electrode film 60 is heated concurrently with the piezoelectric layer 70 when the piezoelectric layer 70 is formed by baking. As a result, the lower electrode film 60 and the piezoelectric layer 70 are transformed into an alloy. The manufacturing method is not limited to this. According to an allowable practice, the lower electrode film 60 is, first, formed of an alloy, and then the piezoelectric layer 70 is formed on the lower electrode film 60.

Figure 7:
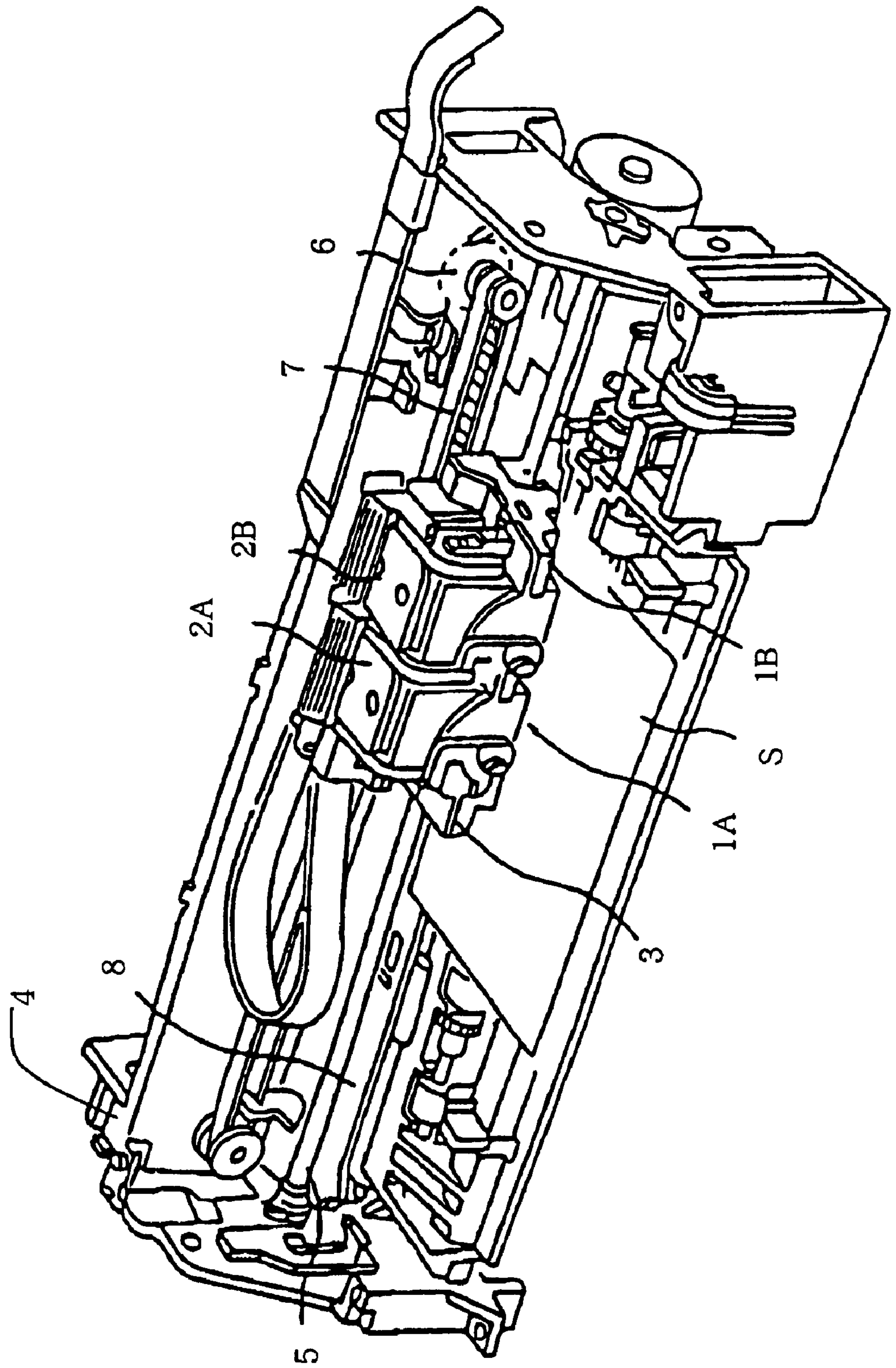
FIG. 7 is a schematic view of an ink-jet recoding apparatus according to an embodiment of the invention.

Furthermore, the ink-jet recording head of each embodiment constitutes a part of a recording head unit that includes an ink passage communicating to an ink-cartridge or the like. The ink-jet recording head is mounted on an ink-jet recording apparatus. FIG. 7 is a schematic view showing an example of such an ink-jet recoding apparatus.

As shown in FIG. 7, a cartridge 2A and a cartridge 2B, which constitute ink supplying means, are detachably provided respectively to recording head units 1A and 2A each including an ink-jet recording head. A carriage 3 having the recording head units 1A and 1B mounted thereon is provided on a carriage shaft 5 fixed to an apparatus body 4, in a state freely movable along the axial direction of the carriage shaft 5. These recording head units 1A and 1B are, for example, configured to eject a black ink composition and a color ink composition, respectively.

The driving force of a drive motor 6 is transmitted to the carriage 3 through a plurality of unillustrated gears and a timing belt 7. The carriage 3 having the recording head units 1A and 1B mounted thereon is thus moved along the carriage shaft 5. On the other hand, a platen 8 is provided along the carriage shaft 5 in the apparatus body 4, and a recording sheet S, which is a recording medium such as paper fed by an unillustrated feed roller or the like, is conveyed by being wound around the platen 8.

Furthermore, the above Embodiment 1 has been described by taking the ink-jet recording head as an example of a liquid-jet head. The target of the invention, however, is so broad as to include liquid-jet heads at large. It is, for this reason, obviously possible to apply the invention to a liquid-jet head that ejects a liquid other than ink. Examples of liquid-jet heads that eject a liquid other than ink include: various recording heads used for image recording apparatuses such as a printer; a color-material-jet head used for manufacturing color filters of a liquid crystal display and the like; an electrode-material-jet head used for forming electrodes of an organic EL display, a field emission display (FED) and the like; a bio-organic-matter-jet head used for manufacturing biochips. In addition, the invention can be applied not only to an actuator device mounted on a liquid-jet head (such as an ink-jet recording head) but also to actuator devices mounted on apparatuses of all kinds.

The invention claimed is:

1. An actuator device comprising a piezoelectric element including a lower electrode, a piezoelectric layer and an upper electrode, wherein the lower electrode includes platinum, oxygen and lead, the content ratio of the lead to the platinum is 1% to 12%, and the Young's modulus of the lower electrode is not less than 200 GPa.

2. The actuator device according to claim 1 wherein the lower electrode essentially contains at least one metal selected from the group consisting of molybdenum, tantalum, iridium, vanadium, tungsten and chromium.

3. The actuator device according to claim 1 wherein the piezoelectric element is provided on the substrate with a vibration plate interposed in between, and the lower electrode functions as a part of the vibration plate.

4. The actuator device according to claim 1 wherein each of the layers of the piezoelectric element is formed by a film-forming method and a lithography method.

5. A liquid-jet head comprising an actuator device according to claim 1.

6. A liquid-jet apparatus comprising a liquid-jet head according to claim 5.

* * * * *